United States Patent [19]
Polk

[11] Patent Number: 4,924,963

[45] Date of Patent: May 15, 1990

[54] COMPACT AND EFFICIENT SUB-WOOFER SYSTEM AND METHOD FOR INSTALLATION IN STRUCTURAL PARTITIONS

[75] Inventor: Matthew S. Polk, Baltimore, Md.

[73] Assignee: Polk Investment Corp., Wilmington, Del.

[21] Appl. No.: 294,150

[22] Filed: Jan. 5, 1989

[51] Int. Cl.[5] .................................. H05K 5/00

[52] U.S. Cl. .................................. 181/144; 181/141; 181/150; 181/156; 181/199

[58] Field of Search ............... 181/141, 144, 150, 154, 181/156, 199

[56] References Cited

U.S. PATENT DOCUMENTS

| | | | |
|---|---|---|---|
| 3,108,653 | 10/1963 | Valldeperas | 181/150 |
| 3,642,091 | 2/1972 | Wohara et al. | 181/150 |
| 4,356,881 | 12/1982 | Lowell | 181/150 |
| 4,549,631 | 10/1985 | Bose | 181/155 |

OTHER PUBLICATIONS

"Bandpass Loudspeaker Enclosures"-Audio Engineering Society, Nov. 1986, Geddes.

"A Bandpass Loudspeaker Enclosure"-Audio Engineering Society, May, 1989, Fincham.

Brochure (undated) KEF Automotive Series, KAR 200SW WLF Unit.

*Primary Examiner*—B. R. Fuller

*Attorney, Agent, or Firm*—Sherman O. Parrett

[57] ABSTRACT

A loudspeaker system is provided for installation in a space between a front panel and an enclosed area behind the front panel of a partition such as a wall, ceiling or floor fronting a listening area. Electroacoustical transducers are provided which have a two sided vibratory diaphragm driven by an electrical signal. An enclosure mounts the electroacoustical transducers such that one side of the vibratory diaphragm is in contact with air outside the enclosure, with the enclosure being configured to substantially enclose and define a specific volume of air within the enclosure having a predefined acoustic compliance and which is in contact with the other side of the vibratory diaphragm of the electroacoustical transducers. The enclosure is mounted to the structural partition such that the enclosure extends into the space behind the front panel of the partition so that the one side of the vibratory diaphragm contacts a volume of air outside the enclosure within the space behind the front panel of the partition. A passive radiator such as a port which has a predetermined acoustic mass is provided for coupling the specific volume of air enclosed by the enclosure to the air outside the enclosure in the listening area. With such an arrangement, the electroacoustical transducer itself and the enclosure are concealed within the structural partition, while the volume of air outside the enclosure means within the space behind the front panel of the partition is substantially acoustically isolated over the approximate frequency range of operation of the electroacoustical transducer from the volume of air outside the enclosure within the listening area.

21 Claims, 8 Drawing Sheets

COMPACT AND EFFICIENT SUB-WOOFER SYSTEM AND METHOD FOR INSTALLATION IN STRUCTURAL PARTITIONS

BACKGROUND OF THE INVENTION

The present invention relates to a sub-woofer loudspeaker system and method for compact, efficient installation in structural partitions, such as walls, ceilings, floors, or automobile panels.

The generation of people now entering mid-career and raising families of their own are also the first generation to have grown up with the easy availability of reasonably priced high-fidelity sound reproduction equipment and an ever expanding selection of popular music. As a result of the demographic changes that are occurring in this group, they are spending increasing amounts of time at home. However, high quality reproduction of recorded music continues to be an important part of their lives. Along with maturity and adult responsibilities, however, appearance of their homes has also become important.

While it is not difficult to design small and inconspicuous loudspeaker systems for reproducing the higher frequency ranges of recorded music, the requirements for reproducing the lower range of frequencies traditionally result in large, obtrusive speaker systems. Such large speaker systems can detract from the appearance of a room, not to mention leading to problems in furniture placement, etc.

OBJECTS AND SUMMARY OF THE INVENTION

It is an object of the present invention to provide a speaker system of high quality and extended low frequency range which can be inconspicuously installed into the typical structural partitions, such as walls, ceilings or floors of a home or business. The principles of this invention are also applicable to installing such a speaker system in panels of an automobile interior.

It is another object of this invention to provide such a speaker system in which system performance is relatively independent of the specific conditions found in the structural partitions at the time of installation.

It is a further object of this invention to provide such a speaker system which is reasonably efficient over a frequency range broad enough to allow it to be used with small, independently mounted speaker systems specifically designed to reproduce the middle and higher frequency ranges.

It is a still further object of this invention to provide such a speaker system which is flexible enough to permit mounting in virtually any of the myriad combinations of materials and construction methods which may constitute the partitions of a given building, whether being newly constructed or existing.

Briefly, in accordance with one embodiment of the invention, a loudspeaker system is provided for installation in a space defined by a front panel and an enclosed area behind the front panel of a structural partition. For example, the structural partition is a wall, ceiling or floor fronting a listening area. Electroacoustical transducing means is provided which has a two sided vibratory diaphragm with means provided for coupling an electrical signal to the electroacoustical transducing means for driving it. Enclosure means is provided for mounting the electroacoustical transducing means such that one side of the vibratory diaphragm is in contact with air outside the enclosure means, with the enclosure means being configured to substantially enclose and define a specific volume of air within the enclosure having a predefined acoustic compliance and which is in contact with the other side of the vibratory diaphragm of the electroacoustical transducing means. Means are provided for mounting the enclosure means to the structural partition such that the enclosure means extends into the space behind the front panel of the partition so that the one side of the vibratory diaphragm contacts a volume of air outside the enclosure means within the space behind the front panel of the partition. A passive radiating means characterized by having a predetermined acoustic mass is provided for coupling the specific volume of air enclosed by the enclosure means to the air outside the enclosure means in the listening area. With such an arrangement, the electroacoustical transducer itself and the enclosure are concealed within the structural partition, while the volume of air outside the enclosure means within the space behind the front panel of the partition is substantially acoustically isolated over the approximate frequency range of operation of the electroacoustical transducing means from the volume of air outside the enclosure means within the listening area.

Other objects and advantages of the present invention will appear from the accompanying drawings considered in conjunction with the detailed description of a preferred embodiment of the invention.

DETAILED DESCRIPTION

Perhaps the most vexing problem of installing a high quality sub-woofer system in a typical structural partition such as a wall, is the thickness of the wall itself. A typical single-family residential wall is constructed with sheet-rock fastened to two-by-fours. However, a two-by-four is now only 1.5" by 3.5". Sheet-rock may be as little as 0.5" thick. This means that there is, at most, four inches to work with from the outside face of the wall to the inside face of the sheet-rock opposite. Sixteen inches between wall studs is considered standard, leaving 14.5 inches in width to work with. An adequate conventional cabinet size for obtaining deep bass response from an eight inch driver with moderated efficiency might be 1.5 cubic feet, at a minimum. Enclosure wall thicknesses of 3/16 inch would have to be considered a minimum. This would indicate that a cabinet over 50 inches high would be required to achieve the required volume for a single eight inch driver, assuming the driver itself was shallow enough to fit.

One possibility is that a speaker design might rely on the volume of air enclosed by the wall itself to substitute for an enclosure. However, the variety of construction techniques and materials used make it impossible to consider any volume of enclosed air as standard, let alone questions of leakage or wall stiffness.

The solution to this problem, in accordance with the present invention, is to provide a system that builds on a novel variation of a woofer type known as a "band-pass" sub-woofer. This design concept was first explained in detail in a paper entitled "A Bandpass Loudspeaker Enclosure", presented to the Audio Engineering Society in May of 1979 by Laurie Fincham of KEF Electronics Limited, U.K. The concept was treated in somewhat greater theoretical detail again in a paper entitled "Bandpass Loudspeaker Enclosures" presented to the Audio Engineering Society in November, 1886 by Earl Geddes of Ford Motor Company. Moreover, in October of 1985 U.S. Pat. No. 4,549,631 was granted to Dr. Amar Bose for an extension of this design concept.

In both the Fincham and Geddes papers a double cavity design is disclosed wherein the two cavities are separated by a baffle on which is mounted one or more transducers. The first cavity is sealed while the second cavity is "ported." That is, the cavity is ported by being provided with an opening of a specific cross-sectional area and length which contains a specific acoustic mass of air. The mass and compliance of the transducer forms a driven resonant system with the compliance of the air in the first sealed cavity. The acoustic mass of air in the port forms a second resonant system with the compliance of the air in the second cavity. The combination of the two is represented by the equivalent electrical circuit shown in FIG. 1.

Figure 1:
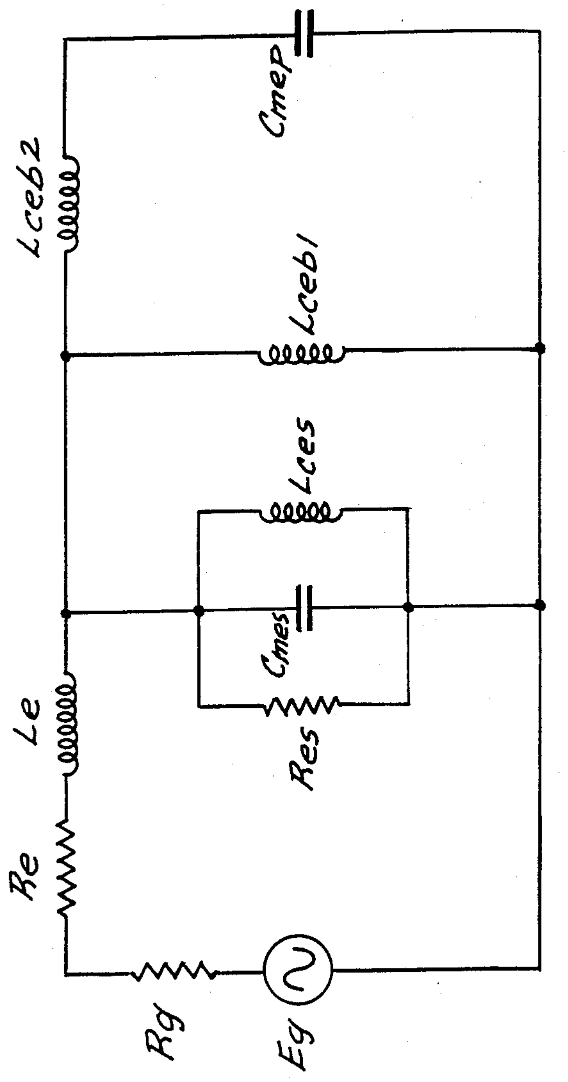
FIG. 1 is an electrical equivalent circuit diagram of a prior art arrangement disclosed in a 1979 paper by Laurie Fincham.
Figure 2:
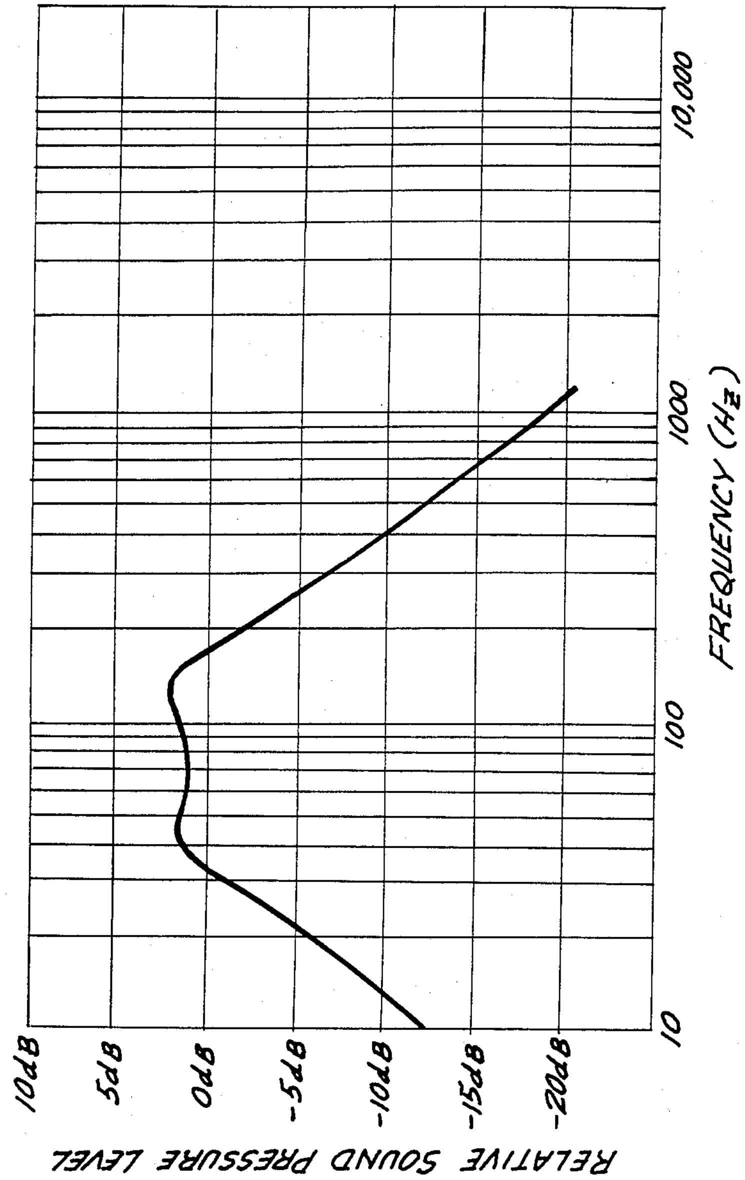
FIG. 2 is a graph of the frequency response of the system represented by the circuit of FIG. 1.

In FIG. 1, the various elements shown will be immediately recognized by anyone skilled in the art. Values are calculated from measurable system parameters and correspond as follows:

Eg—voltage output of a constant voltage generator
Rg—output impedance of the generator
Re—voice coil DC resistance of transducer
Le—voice coil inductance of transducer
Res—mechanical loss of transducer
Cmes—acoustic mass of transducer
Lces—acoustic compliance of transducer suspension
Lcebl—acoustic compliance of sealed cavity
Rlebl—leakage loss of sealed cavity
Lceb2—acoustic compliance of ported cavity
Rleb2—leakage loss of ported cavity
Cmep—acoustic mass of air in port Analysis of the equivalent circuit of FIG. 1 shows that the frequency response output of the system of FIG. 1 using the two cavities is a band-pass characteristic, as shown in FIG. 2.

As disclosed by both Geddes and Bose, the frequency range of the band-pass may be extended by using a port in the sealed cavity also. This second port is tuned to a different frequency such that the phase of the acoustic outputs of the two ports adds where they overlap to create a smooth overall response.

The present invention departs from the systems of the prior art described above in that it dispenses with the first sealed cavity altogether. Referring to FIG. 3A, there is shown a diagrammatic cross-sectional view illustrating the principles of the present invention. A structural partition 11, such as a wall, floor or ceiling, has a front panel 12 and a rear panel 13 separated by a space 14 enclosed therebetween. An enclosure 16 has an electroacoustical transducer mounted therein. Specifically, in FIG. 3A two separate transducers 17 and 18 are mounted in a wall of the enclosure 16. The transducers 17 and 18 have a two-sided vibratory diaphragm, one side of which faces into the air space 14 of the structural partition 11 and the other side of which faces into an air volume 19 defined by and substantially enclosed by the configuration of the enclosure 16. Terminals 21 and 22 in FIG. 3A diagrammatically illustrate provision for coupling electrical signals to the transducers 17 and 18 for driving them. As shown in FIG. 3A, a passive radiator is used for coupling the specific volume of air 19 defined within the enclosure 16 to the air outside the front panel 12 constituting the listening area. In the specific embodiment of FIG. 3A, this passive radiator comprises a port opening 23 from the interior of the enclosure 16 to the outside listening area.

Figure 3B:
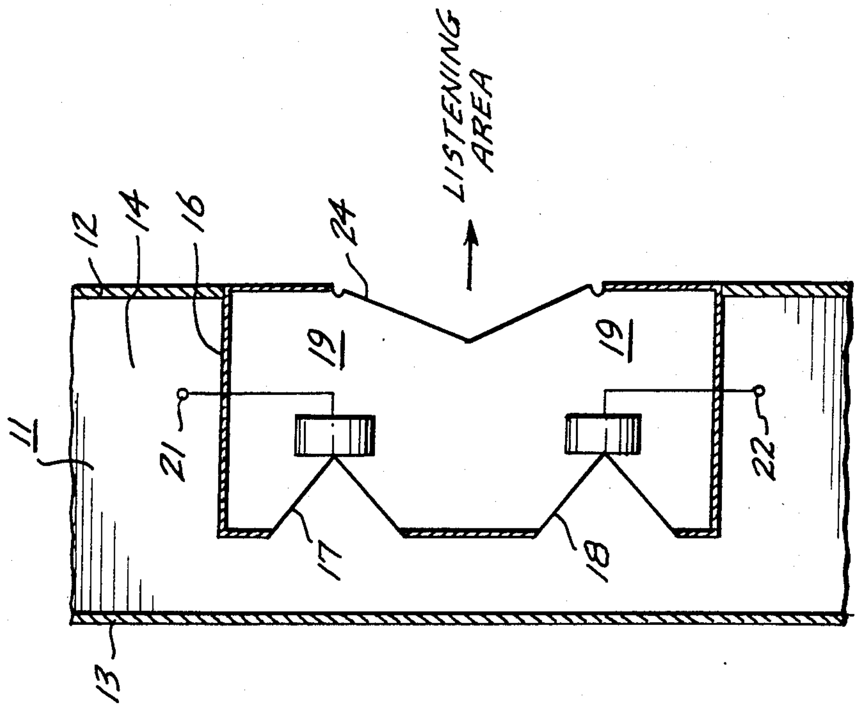
FIG. 3B is a schematic diagram of an alternate embodiment of a speaker system in accordance with the present invention using a drone cone as a passive radiator into the listening area.
Figure 3A:
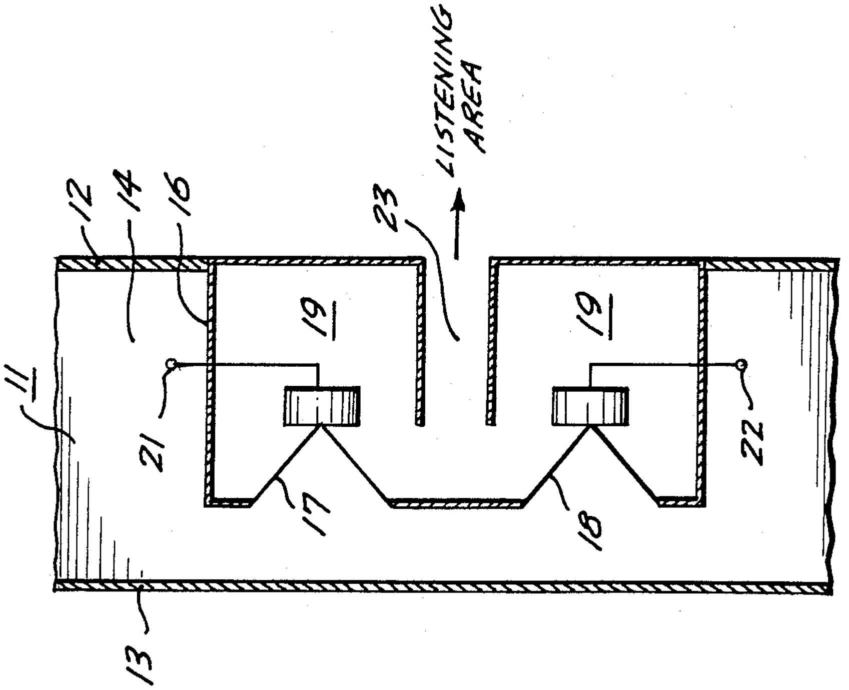
FIG. 3 is a schematic diagram of a speaker system in accordance with the present invention, illustrating the manner of installation in a structural partition.

FIG. 3B is similar to FIG. 3A, and like elements in FIG. 3B have been given identical reference numerals to corresponding elements in FIG. 3A. The alternate embodiment of the invention shown in FIG. 3B is one in which the passive radiator means for coupling the specific air volume 19 within enclosure 16 to the outside listening area is a drone cone 24 instead of a port.

Figure 4:
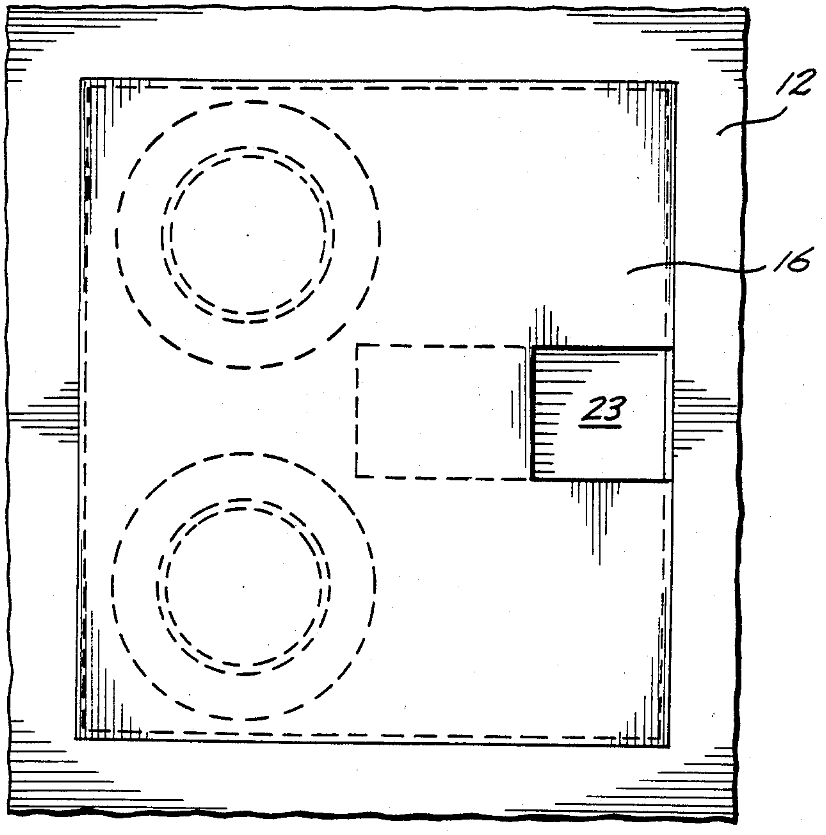
FIG. 4 is a front elevation of the speaker system of the present invention shown installed in a structural partition.
Figure 5:
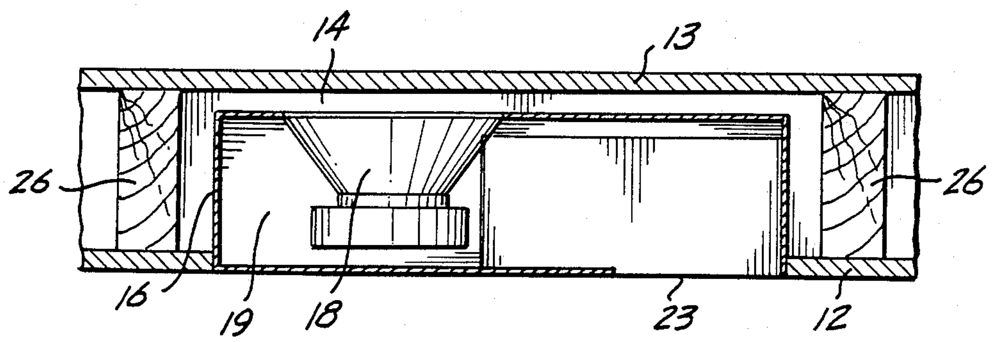
FIG. 5 is a cross-sectional side view of the speaker system of FIG. 4.

FIG. 4 is a front elevation of the speaker system of FIG. 3A in accordance with this invention shown installed in a structural partition such as a wall, and FIG. 5 is a cross-sectional view of the speaker system of FIG. 4. Elements in FIGS. 4 and 5 have been given the same reference numerals as corresponding elements shown diagrammatically in FIG. 3A. As shown in FIG. 5, the front and back panels 12 and 13 of the structural partition such as a wall are typically spaced by two-by-fours 26.

As shown in FIGS. 3A, 4 and 5, the loudspeaker system in accordance with the present invention comprises an enclosure with a baffle for the mounting of one or more transducers on one side and a port opening on the other side. The entire system is mounted into a wall or other partition such that the transducers are inside the wall and the port opening is exposed to the listening area, i.e., inside a room. The enclosure or volume of air 14 formed by the front and back panels and other structural components of the partition 11 serves mainly to prevent the acoustic radiation from the other side of the transducers facing the air volume 14 from interfering destructively with the desirable acoustic radiation from the port 23.

It has previously been assumed, quite naturally, that the variability in the characteristics of the enclosure formed by the panels of the partition or wall (e.g., volume, leakage loss, vibration loss, internal loss, etc.) would preclude the choice of any one set of design parameters which would be suitable for all mounting situations one might encounter. However, experiments have shown that the volume of air enclosed inside wall or structural partitions of quite disparate construction materials and techniques invariably appears, acoustically, to be quite large with substantial leakage and internal losses. These losses are of such a magnitude as to substantially minimize the effect on tuning of the system of changes of up to a factor of ten in the apparent volume of the enclosed air. In addition, design parameters for the rest of the system can be chosen such that the performance will be substantially unchanged for the vast majority of mounting situations.

Figure 6:
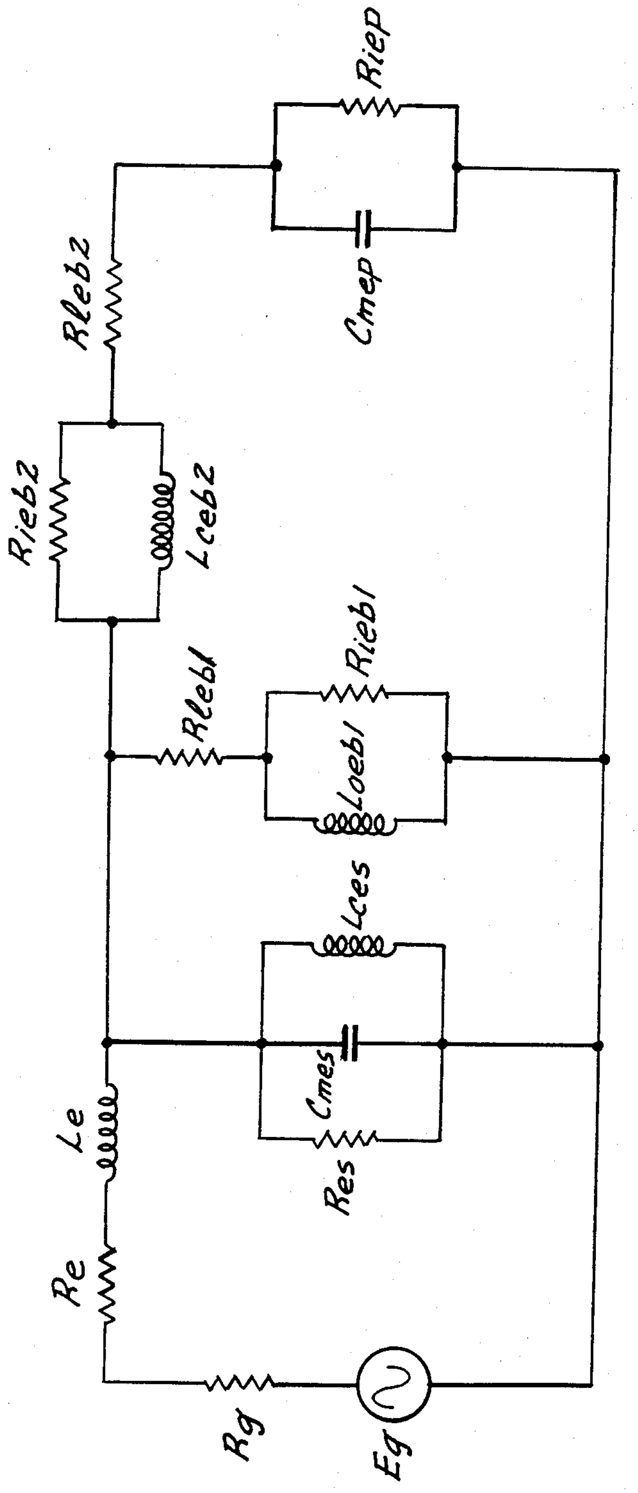
FIG. 6 is an electrical equivalent circuit diagram of the speaker system of FIGS. 3–5.
Figure 7A:
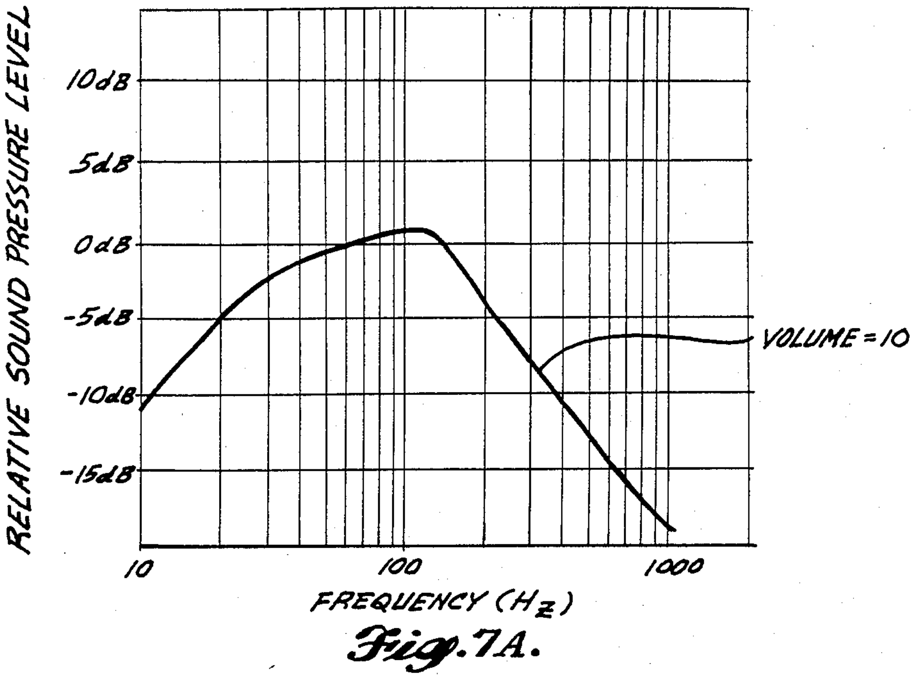
FIG. 7A is a graph of the frequency response of the speaker system of FIGS. 3–6 for a volume of air contained within the structural partition in which the system is mounted, of a relative volume value of 10.
Figure 7B:
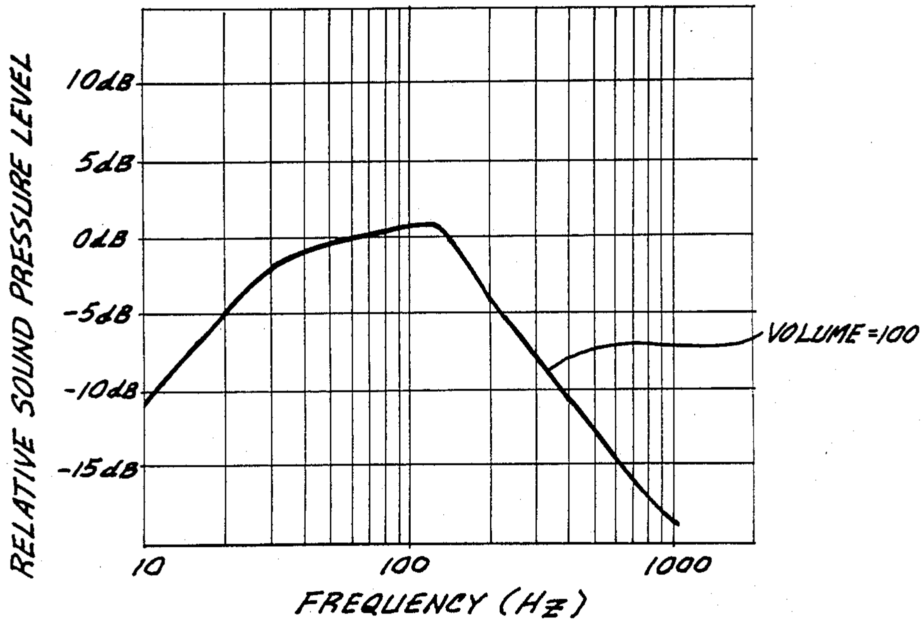
FIG. 7B is a graph of the frequency response of the speaker system of FIGS. 3–6 for a volume of air contained within the structural partition in which the system is mounted, of a relative volume value of 100, ten times that of FIG. 7A.

Referring now to FIG. 6, there is shown an electrical equivalent circuit diagram of the speaker system of FIGS. 3–5. The elements shown in FIG. 6 follow the same convention as the circuit of FIG. 1, with the addition of some new elements which correspond as follows:

Rleb1—leakage losses for wall cavity
Rieb1—internal and vibrational losses of wall cavity
Rleb2—leakage losses for ported cavity
Rieb2—internal losses of ported cavity
Riep—internal losses of port Leakage and vibrational losses are usually negligible for commercially constructed loudspeaker enclosures but have been shown, by experiment, to be significant for most wall mounting situations. In addition, size and space limitations prohibit the use of a port arrangement optimized for minimum internal loss. Therefore, port internal losses play an important role in the ultimate performance of the system. Leakage loss for the ported cavity should be negligibly small while internal losses will be a controllable design parameter. The equivalent electrical circuit element values for a preferred embodiment of the invention as shown in the drawings are as follows:

Eg—1.00 Volt
Rg—0.01 Ohm
Le—0.20 mH
Re—2.20 Ohm
Lces—8.50 mH
Res—12.00 Ohm
Cmes—962.00 uf
Rleb1—8.00 Ohm
Lceb1—50.00 mH
Rieb1—5.00 Ohm
Rleb2—0.02 Ohm
Lceb2—2.70 mH
Rieb2—30.00 Ohm
Cmep—1950.00 uf
Riep—6.00 Ohm An analysis of this circuit of FIG. 6 shows that appropriate choices for the transducer and ported cavity parameters makes the system performance substantially independent of the characteristics of the wall cavity. Specifically as shown by FIGS. 7A and 7B, the calculated frequency responses for two values of the volume of air enclosed within the wall but differing by a factor of ten (Vol.=10 in FIG. 7A, Vol.=100 in FIG. 7B) are virtually identical. Experiments have confirmed the predictions made by this model.

In accordance with one preferred embodiment of the invention, the two transducers 17 and 18 are 6.5 inch drivers. The entire enclosure 16 has approximate dimensions of 12 inches wide, 18 inches high and 3 inches deep. These dimensions allow the system to be mounted in the depth of a standard two-by-four stud wall or partition without impairing performance. The circuit element values used above are calculated from easily realizable system parameters. In addition, as particularly shown in FIGS. 4 and 5, the system may be mounted essentially flush into the wall or other partition and "painted out" leaving a roughly 6 square inch port opening 23 as the only evidence of its presence. An additional advantage of the present invention is that its band-pass characteristics substantially reduce the cost and complexity of the electrical crossover network required to blend its performance with the higher frequency units.

As previously mentioned in connection with FIG. 3B, one variation on the system of the present invention is to use a drone cone 24 as the passive radiator output of the system. An advantage to this approach is that a drone cone radiator may be constructed with much less loss than the practical realization of the port version of the system in the preferred embodiment discussed above. This would contribute to improved efficiency at the lower frequencies reproduced by the present invention. An obvious disadvantage to such an arrangement, however, is that a drone cone passive radiator for this application, say on the order of 8 inches in diameter, would have a much larger surface area than that of the port opening and would be much more visually obtrusive.

It should be clear that the present invention is not limited to loudspeaker systems for mounting only in wall, floor or ceiling structural partitions. The same principles are applicable to mounting in structural partitions in the interior of automobiles, where many of the same conditions (mainly of uncertainty) apply to situations where a consistent level of performance is required in a variety of different thru-panel mounting situations. Thus, the schematic drawing of FIGS. 3A and 3B apply where the partition 11 is a partition in an automobile with front panel 12 being an interior panel of the automobile It should also be noted that the preferred embodiment of the present invention, which uses at least two transducers 17 and 18 mounted in the enclosure, offers an additional advantage. Specifically, one of the transducers can be electrically driven by one of the two stereo output channels and the other transducer driven by the other of the two stereo output channels. Such an arrangement creates a center channel sub-woofer without the need for electrically combining the two channels.

Figure 11:
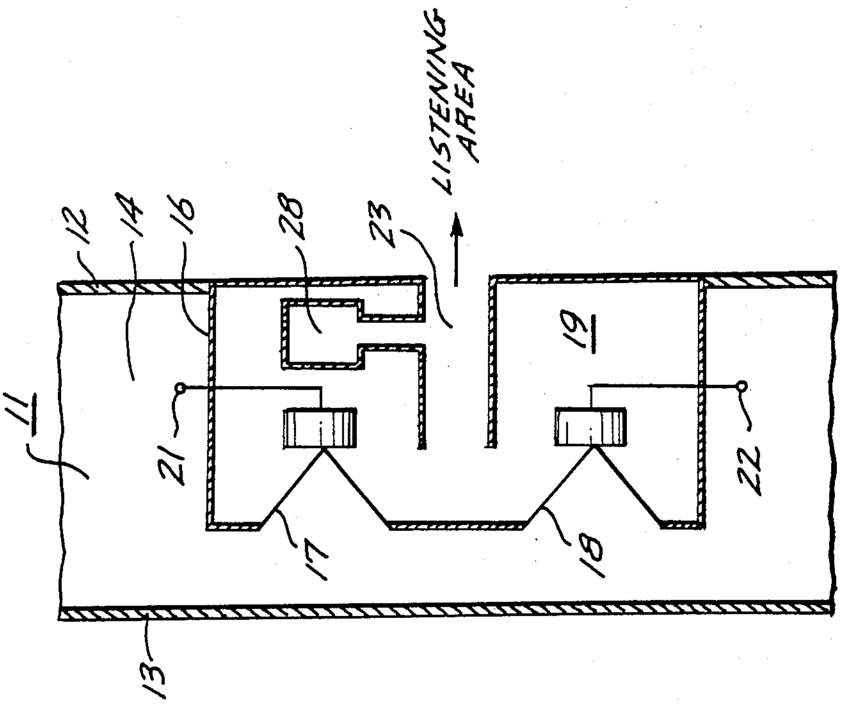
FIG. 11 is a schematic diagram of a speaker system as in FIG. 8 but further including an acoustic mass and an acoustic compliance (Helmholtz resonator) coupled to the port tube for removing specific unwanted frequencies.
Figure 8:
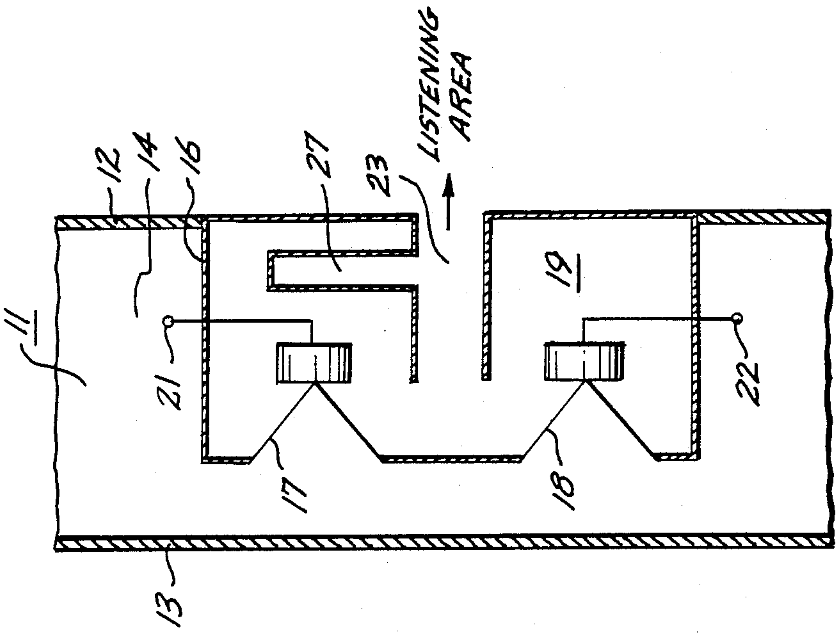
FIG. 8 is a schematic diagram of a speaker system as in FIG. 3 but including an acoustic trap for removing unwanted frequencies in the system output to the listening area.
Figure 9:
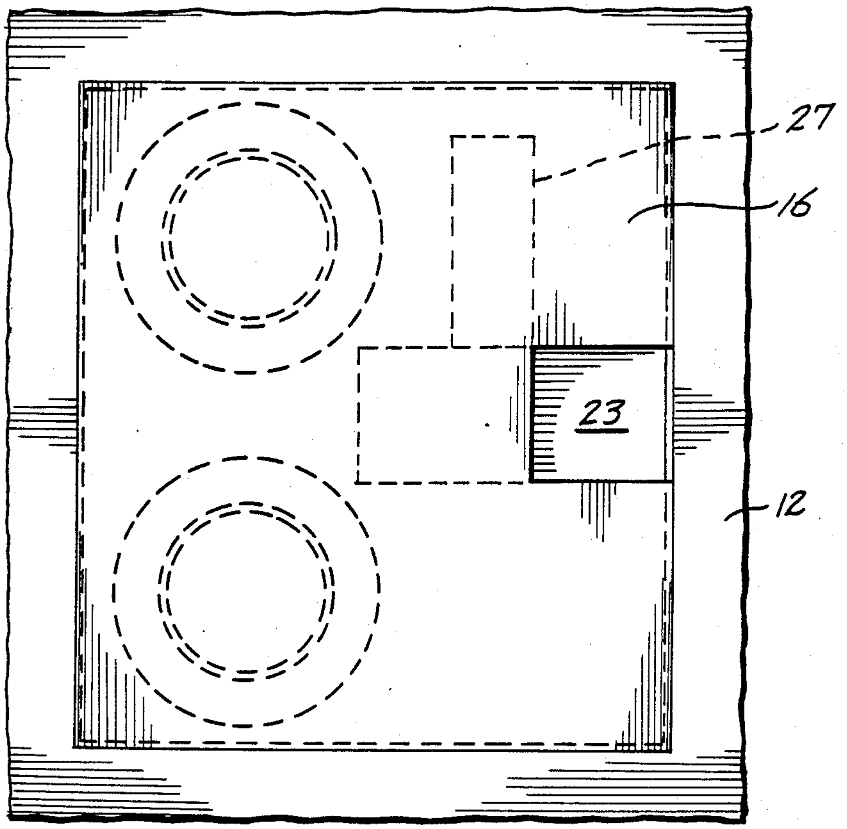
FIG. 9 is a front elevation of the speaker system of FIG. 8.
Figure 10:
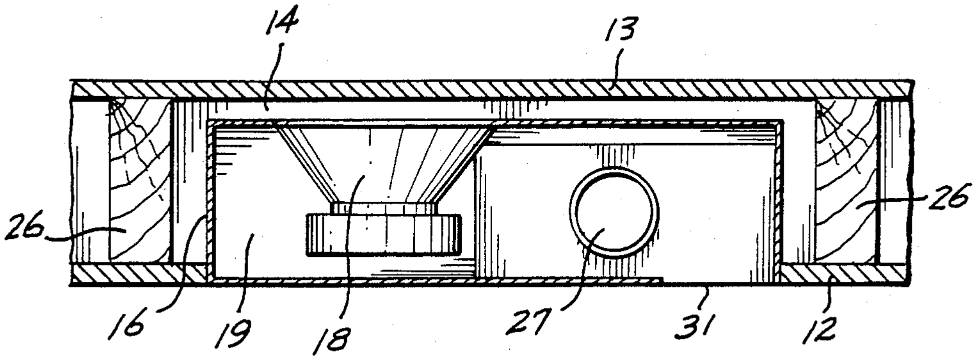
FIG. 10 is a cross-sectional side view of the speaker system of FIG. 9.

One difficulty or potential problem should be addressed at this point. Specifically, the port opening 23 (FIGS. 3A, 4, 5) will act as a transmission line at frequencies where the port length is an odd multiple of one-half wavelength. At these frequencies, energy will be transmitted from the interior of the ported cavity to the listening area with very little attenuation. Usually the frequencies at which this occurs will be far enough above the desired operating range that they can be easily attenuated with a simple low-pass network at the input to the transducers. However, when the length of the port is relatively long, the lowest transmission line frequency may be too close to the operating range to permit attenuation using a simple network. The solution to this problem, in accordance with the present invention and as shown in FIGS. 8, 9 and 10, is to provide an acoustic trap 27 to eliminate the undesirable frequencies. This trap may be a tube sealed at one end and opening into the side of the port at its other end, with its length being one-fourth of the wavelength of the lowest undesirable frequency. As an alternative, and as shown schematically in FIG. 11, the trap may consist of a Helmholtz resonator 28 opening into the side of the port. A Helmholtz resonator, as known to those skilled in the art, consists of an acoustic mass and an acoustic compliance tuned to resonate at the undesirable frequency. In this case, the resonator would consist of a small sealed cavity of appropriate volume connect to the side of the port by a tube containing the desired acoustic mass, as shown in FIG. 11.

In accordance with the one preferred embodiment of the present invention as discussed above, the port dimensions created an unwanted transmission line frequency at approximately 500 Hz, which was removed by the use of a quarter wave trap (FIGS. 8, 9 and 10) approximately 6.3 inches in length and 1.4 inches in diameter.

Although the present invention has been described and illustrated in connection with specific presently preferred embodiments, it should be understood that many variations are possible without departing from the true spirit and scope of the present invention, which is to be measured by the following claims.

I claim:

1. A loudspeaker system for installation in a space defined by a front panel and an enclosed area behind the front panel of a structural partition fronting a listening area comprising:

electroacoustical transducing means having a two sided vibratory diaphragm;

means for coupling an electrical signal to said electroacoustical transducing means for driving same;

enclosure means for mounting said electroacoustical transducing means such that one side of said vibratory diaphragm is in contact with air outside said enclosure means and said enclosure means substantially enclosing and defining a specific volume of air within said enclosure having a predefined acoustic compliance and which is in contact with the other side of said vibratory diaphragm of said electroacoustical transducing means;

means for mounting said enclosure means to the structural partition such that said enclosure means extends into the space behind the front panel of the partition so that the one side of said vibratory diaphragm contacts a volume of air outside said enclosure means within the space behind the front panel of the partition;

passive radiating means characterized by having a predetermined acoustic mass for coupling the specific volume of air enclosed by said enclosure means to the air outside said enclosure means in the listening area:

whereby the volume of air outside said enclosure means within the space behind the front panel of the partition is substantially acoustically isolated over the approximate frequency range of operation of said electroacoustical transducing means from the volume of air outside said enclosure means within the listening area.

2. A loudspeaker system as defined in claim 1 wherein said means for mounting said enclosure means to the structural partition comprises means for mounting said enclosure means in a wall.

3. A loudspeaker system as defined in claim 1 wherein said means for mounting said enclosure means to the structural partition comprises means for mounting said enclosure means in a floor.

4. A loudspeaker system as defined in claim 1 wherein said means for mounting said enclosure means to the structural partition comprises means for mounting said enclosure means in a ceiling.

5. A loudspeaker system as defined in claim 1 wherein said means for mounting said enclosure means to the structural partition comprises means for mounting said enclosure means in a panel of an automobile.

6. A loudspeaker system in accordance with claim 1 wherein at least one dimension of said enclosure means is less than four inches.

7. A loudspeaker system in accordance with any of claims 1 through 6 wherein said passive radiating means comprises a port tube.

8. A loudspeaker system in accordance with any of claims 1 through 6 wherein said passive radiating means comprises a drone cone.

9. A loudspeaker system in accordance with claim 7 wherein said port tube includes an acoustic trap for removing specific unwanted frequencies coupled to said port tube.

10. A loudspeaker system in accordance with claim 9 wherein said acoustic trap comprises an acoustic mass and an acoustic compliance coupled to said port tube.

11. A loudspeaker system in accordance with claim 9 wherein said acoustic trap comprises a tube closed at one end and of length equal to one-fourth wavelength at the lowest undesirable frequency and coupled to said port tube at the other end.

12. A loudspeaker system in accordance with claim 1 wherein said electroacoustical transducing means comprises at least two separate transducers.

13. A loudspeaker system in accordance with claim 1 wherein said at least two separate transducers include individual means for coupling at least two separate electrical signals to the respective at least two separate transducers.

14. A method for mounting a loudspeaker system in a space defined by a front panel and an enclosed area behind the front panel of a structural partition fronting a listening area, comprising the steps of:

providing an electroacoustical transducing means having a two sided vibratory diaphragm;

providing an enclosure means configured to enclose a specific air volume having a predefined acoustic compliance;

mounting said electroacoustical transducing means to the enclosure means such that one side of the electroacoustical transducing means contacts air outside of the enclosure and the other side of the electroacoustical transducing means contacts the specific air volume within the enclosure means;

mounting the enclosure means to the structural partition such that the enclosure means extends into the space behind the front panel of the partition so that the one side of the vibratory diaphragm contacts a volume of air outside the enclosure means within the space behind the front panel of the partition; and providing a passive radiating means characterized by having a predetermined acoustic mass for coupling the specific volume of air enclosed by the enclosure means to the air outside the enclosure means in the listening area; whereby the volume of air outside the enclosure means within the space behind the front panel of the partition is substantially acoustically isolated over the approximate frequency range of operation of the electro-acoustical transducing means from the volume of air outside the enclosure means within the listening area.

15. A method in accordance with claim 14, including the step of providing a port tube as the passive radiating means.

16. A method in accordance with claim 14, including the step of providing a drone cone as the passive radiating means.

17. A method in accordance with claim 15, including the step of proving an acoustic trap coupled to the port tube for removing specific unwanted frequencies in the port tube.

18. A method in accordance with claim 17, wherein the acoustic trap is provided with an acoustic mass and an acoustic compliance coupled to the port tube.

19. A method in accordance with claim 17, wherein the acoustic trap is configured as a tube closed at one end and of length equal to one-quarter wavelength at the lowest undesirable frequency and coupled to the port tube at the other end.

20. A method in accordance with claim 14, including the step of providing at least two separate electroacoustical transducers.

21. A method in accordance with claim 20, including the step of coupling at least two different electrical signals respectively to the at least two separate electro-acoustical transducers.

* * * * *